(12) United States Patent
Riemer et al.

(10) Patent No.: US 11,109,493 B2
(45) Date of Patent: Aug. 31, 2021

(54) ELECTROLESS PLATING ACTIVATION

(71) Applicant: Hutchinson Technology Incorporated, Hutchinson, MN (US)

(72) Inventors: Douglas P. Riemer, Waconia, MN (US); Kurt F. Fischer, Eau Claire, WI (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 154 days.

(21) Appl. No.: 16/286,352

(22) Filed: Feb. 26, 2019

(65) Prior Publication Data

US 2019/0274224 A1 Sep. 5, 2019

Related U.S. Application Data

(60) Provisional application No. 62/637,238, filed on Mar. 1, 2018.

(51) Int. Cl.
*C23C 18/38* (2006.01)
*C23C 18/32* (2006.01)
*H05K 3/46* (2006.01)
*H05K 3/24* (2006.01)

(52) U.S. Cl.
CPC .......... *H05K 3/4661* (2013.01); *C23C 18/32* (2013.01); *C23C 18/38* (2013.01); *H05K 3/244* (2013.01)

(58) Field of Classification Search
CPC ..... C23C 18/38; C23C 18/32; C23C 18/1619; C23C 18/1637; C23C 18/1628; C23C 18/1675; C23C 18/1671; C23C 18/1848; C23C 18/1831; H05K 3/4661; H05K 3/244
See application file for complete search history.

(56) References Cited

U.S. PATENT DOCUMENTS

| 4,153,523 A | 5/1979 | Koontz et al. |
| 4,842,886 A * | 6/1989 | Anderson ........... C23C 18/1619 427/10 |
| 2012/0251733 A1* | 10/2012 | Tsunekawa ......... C23C 18/1619 427/457 |

FOREIGN PATENT DOCUMENTS

| JP | 62-250178 A | 10/1987 |
| JP | 63-26375 A | 2/1988 |
| JP | 4-254915 A | 9/1992 |
| JP | 2003-64479 A | 3/2003 |

OTHER PUBLICATIONS

Bard, Allen J. et al., "Electrochemical Methods; Fundamentals and Applications", 2nd Ed., John Wiley & Sons, Inc., p. 53, 2001.
(Continued)

*Primary Examiner* — Dah-Wei D. Yuan
*Assistant Examiner* — Nga Leung V Law
(74) *Attorney, Agent, or Firm* — DLA Piper LLP (US)

(57) ABSTRACT

A method of initiating and controlling electroless nickel plating on copper substrates carried into a plating bath on a continuous stainless steel web where the copper is electrically bussed or in physical contact with the steel is described. A bias current is applied to the plating bath and a feedback loop is established to determine initiation of plating as well as to ramp down the biasing current to prevent electro- or electroless plating of the web.

20 Claims, 5 Drawing Sheets

(56) References Cited

OTHER PUBLICATIONS

Flis, J. et al., "Initiation of Electroless Nickel Plating on Copper, Palladium-Activated Copper, Gold, and Platinum", Journal of the Electrochemical Society, vol. 131, No. 2, pp. 254-260, 1984.
Mallory, Glenn O. et al., "Electroless Plating; Fundamentals & Applications", pp. 142-143, 1991.

* cited by examiner

ELECTROLESS PLATING ACTIVATION

CROSS-REFERENCE TO RELATED APPLICATIONS

This application claims the benefit of U.S. Provisional Application No. 62/637,238 filed on Mar. 1, 2018, which is hereby incorporated by reference in its entirety.

FIELD

The present disclosure concerns mitigating the loss reduction due to excess electroless nickel ("E-Ni") coating on a copper substrate carried on a web of stainless steel ("SST") where the copper is electrically bussed or in physical contact with the steel. Prior to this disclosure, annual yield loss at an E-Ni plater are on the order of more than US$500,000 at a production rate of sixty rolls per week. By the use of a current controlled reference voltage applied to the web, with an active feedback loop to maintain the reference voltage at the level required for electroless plating to initiate, the losses of plating on the web are mitigated.

BACKGROUND

Electroless nickel plating is an autocatalytic process whose initiation is the result of the catalytic activity of a given substrate. After initiation of the plating, the process proceeds spontaneously on the deposited-nickel layer.

E-Ni is intended to plate to copper ("Cu") traces and pads, where a palladium ("Pd") activator can optionally be deposited on the Cu. The Pd should act as the catalyst and activate the E-Ni plating. From the scientific literature, "Initiation of Electroless Nickel Plating on Copper, Palladium-Activated Copper, Gold and Platinum", J. Flis and D. J. Duquette, *J. Electrochem. Soc.*: Electrochemical Science and Technology, February 1984, pp. 254-259, incorporated herein by reference in its entirety, a certain pattern of voltage should be observed when plating activates. The voltage should shift negative past the deposition voltage and then remain at a steady-state. Some materials, such as Pd and iron ("Fe"), will plate on their own. Most others do not, so a chemical activator is used, here Pd. See FIG. 1 which plots the Potential, in V ("Volts") versus SCE versus Time for Cu, Cu+Pd, Au and platinum ("Pt").

However, increased yield losses occur because of inconsistent activation of the E-Ni plating. SST can have a significant influence on the activation of E-Ni plating. Activation will be dependent on part/panel design and SST processing, i.e., whether the SST web is passivated or not. In reel to reel plating of a continuous web, the copper surface to be nickel plated can be in electrical contact with the stainless steel substrate, forming a galvanic coupling. The electrical contact can be formed by product design, connecting the copper and stainless steel through vias in the dielectric layer between the copper and stainless steel surfaces. The contact between the copper and stainless steel will generate a small voltage when the web is immersed in plating solution, and this voltage acts as a barrier for the electroless plating reaction. Normal deposition of palladium catalyst may not allow initiation of the plating reaction, and an external voltage is needed. Other factors include the relative amount or area of copper compared to an amount or area of exposed SST through a dielectric material. The previous surface treatment, accidental or intentional of each of the Cu and SST also will affect plating. When there is a problem, the Ni will only plate isolated Cu, and none that is bussed to the SST web. Currently, there is a significant yield loss at E-Ni plater due to activation, or lack of activation.

SUMMARY

In a first embodiment, a current controlled reference voltage is established to the web with an active feedback loop to maintain the voltage at the level required for the electroless plating to initiate.

In another embodiment, a system is employed to offset the changing web conditions caused by bath chemistry changes, copper to SST galvanic couple, and the state of SST passivation.

In a further embodiment, monitoring of the reference voltage conditions in the plating bath and self-adjusting a bias current on the web, either up or down, to maintain the desired reference voltage.

In a still further embodiment, sensing of bias current to determine plating initiation and ramping down current to prevent electro- or electroless-hybrid plating.

These and other embodiments will be better understood when read in conjunction with the detailed description of the embodiments and the appended drawings.

DETAILED DESCRIPTION OF THE EMBODIMENTS

Figure 1:
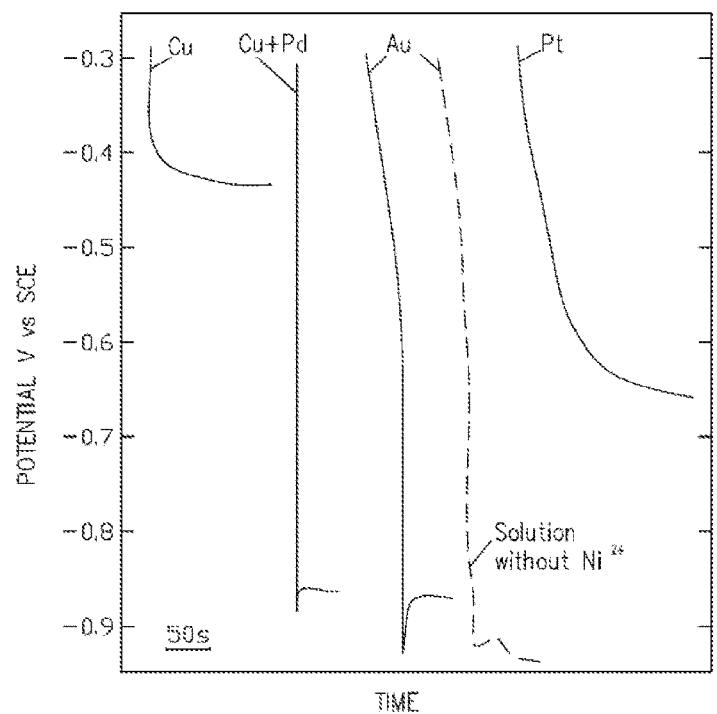
FIG. 1 is a graphical representation which plots the Potential, in V ("Volts") versus SCE versus Time for Cu, Cu+Pd, Au and platinum ("Pt") according to the scientific literature ("Prior Art")

As shown in FIG. 1 (Prior Art) the published scientific literature shows a certain pattern of voltage that should be observed when plating initiates. As shown in FIG. 1, an open circuit potential of copper, palladium-activated copper (activation in the solution of 1 g/L $PdCl_2$+1 ml/L HCl for 5 sec.), gold, and platinum after immersion into a plating solution (solid lines) or into a supporting solution with $NaH_2PO_2$ but without $Ni^{2+}$ ions (dashed line). The voltage should shift negative past the deposition voltage and then remain at a steady-state. Some materials, such as Pd and Au, will plate on their own. Most others do not.

Figure 2:
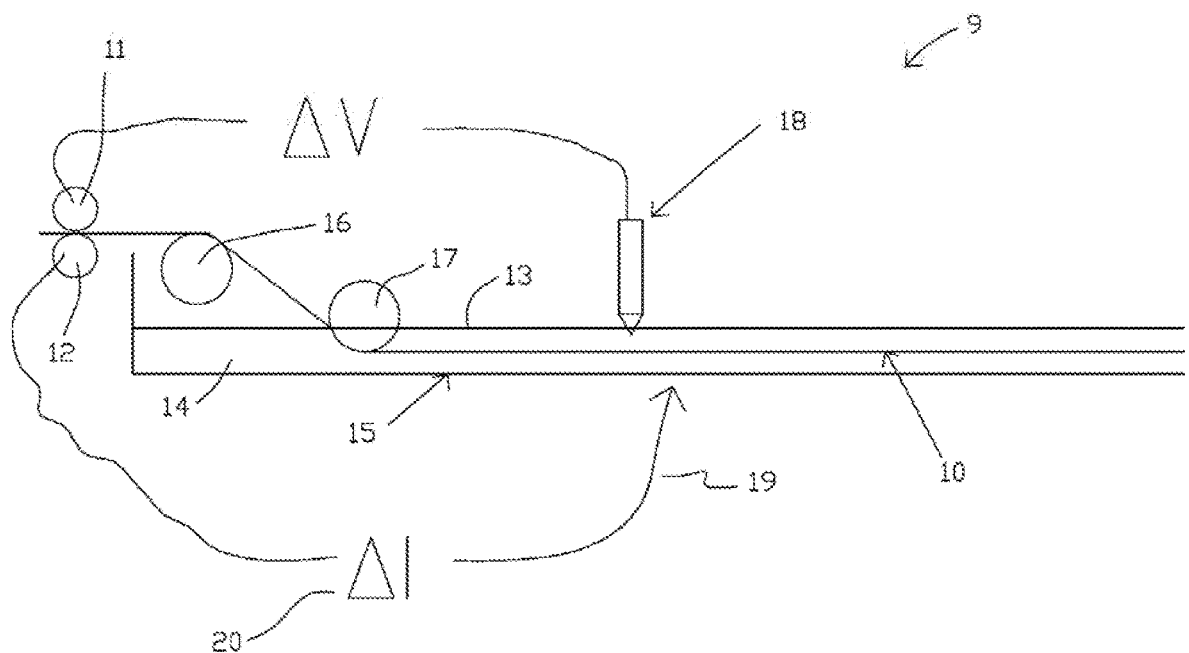
FIG. 2 is a schematic representation of an apparatus and method for adding a sensor to a plating module to provide reliable plating activation feedback by voltage measurement according to an embodiment.
Figure 3:
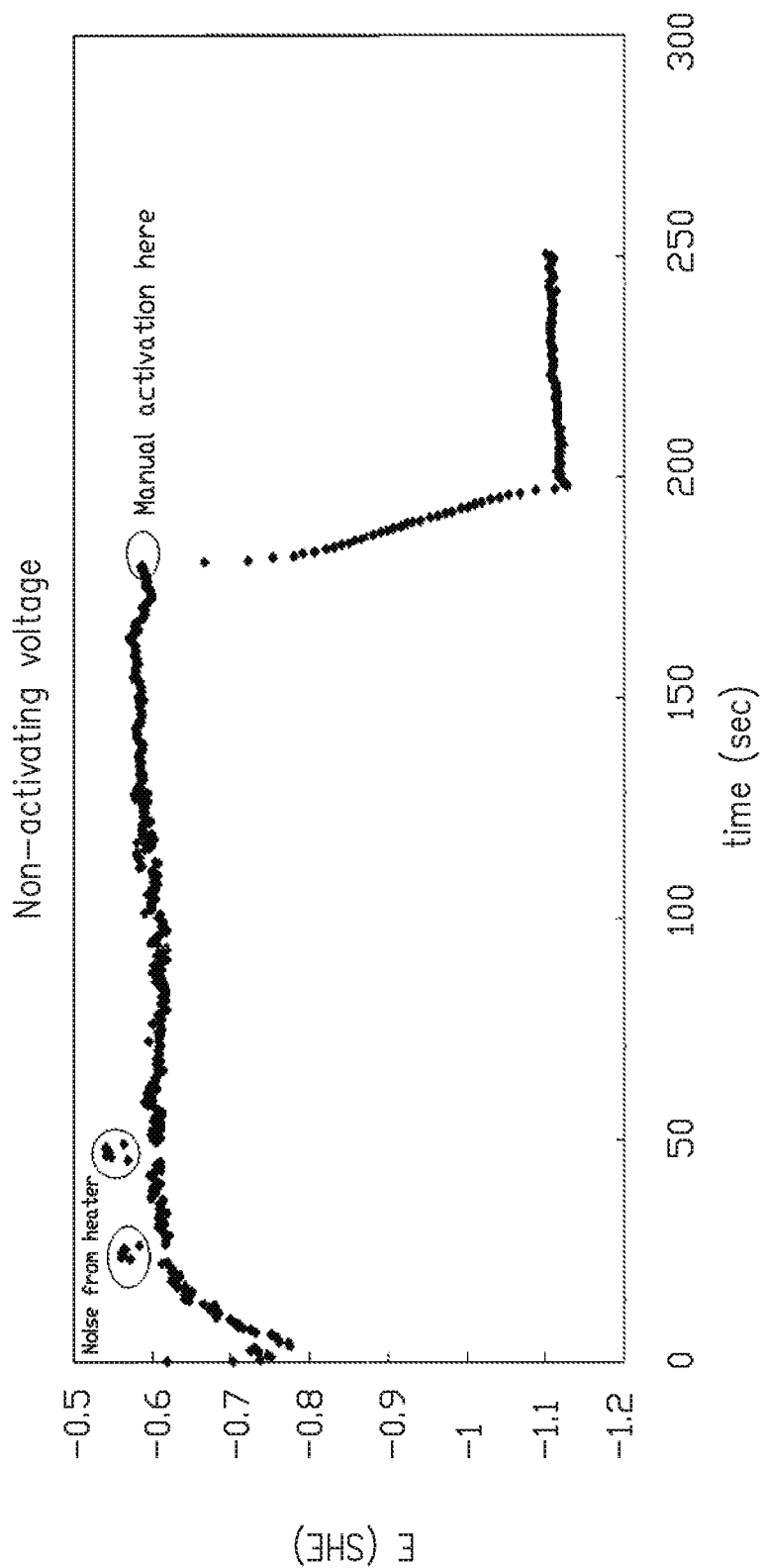
FIG. 3 is a graphical representation of the electromotive force, E, plotted against time (in sec.) up to and after manual activation occurs according to an embodiment.

When E-Ni is intended to plate to Cu traces and pads, a stainless steel web is bussed to the Cu. The Cu is placed on a stainless steel ("SST") web 10, when it is carried into and through a plating bath. Referring to FIG. 2, it can be seen that in system 9, the SST web 10 is carried through a roller pair 11, 12 and introduced below the surface 13 of bath 14, contained within tank 15. Insulating rollers 16, 17 carry the web 10 beneath the surface 13 of bath 14. In order to determine the voltage in the bath and in the web, a reference electrode 18, measures the voltage difference between roller 11 and the bath 14 contacting the SST web 10. A current source 19 from an external rectifier 20 can be used to manipulate the voltage to the desired value. As can be seen from FIG. 3, electromotive force, E, is plotted against time (in sec.) until manual activation occurs, at which time a dramatic voltage drop occurs.

The reference electrode 18 used can be a calomel electrode, which is mercury coated with calomel ($Hg_2Cl_2$) which is stable at high temperature (180° F.), one of the few reference electrodes that are usable. However, the mercury electrodes are very expensive, and contain toxic substances. It is known to those skilled in the art that a "pseudo-reference electrode" or "quasi-reference electrode" can be made from a piece of platinum and is often used in non-aqueous systems (see Bard and Faulkner, "*Electrochemical Methods-Fundamentals and Applications*", John Wiley & Sons, Inc, $2^{nd}$ Ed., 2001, page 53, incorporated in its entirety by reference). Platinum, which is not catalytically active to plating in this system, remains as a platinum surface and works well as a reference electrode 18. The placement of the reference electrode 18 is near to where the SST web 10 enters the bath, rather than downstream of entry into the bath. Located near the entrance where plating is activated, it provides a suitable thickness control, minimizing IR drop due to the activating current, and increases accuracy of the measurement. The tank 15 itself is used as the anode, and it completely surrounds the web 10. This system 9 allows us to plate specifically on the Cu in a bi-metallic process. By holding the voltage within a tight window, we are able to plate on one metal (e.g., Cu) and not the other (e.g., SST). Hybrid electro- or electroless-plating is thus prevented.

Control range is 0.2 V (200 mV)±0.05%. Without the use of the reference electrode 18 in the system 9 it would be impossible to control the voltage in such a tight window. The best that could be achieved without the use of the disclosed system 9, including the reference electrode and externally supplied current, would be about 500 mV.

Figure 4:
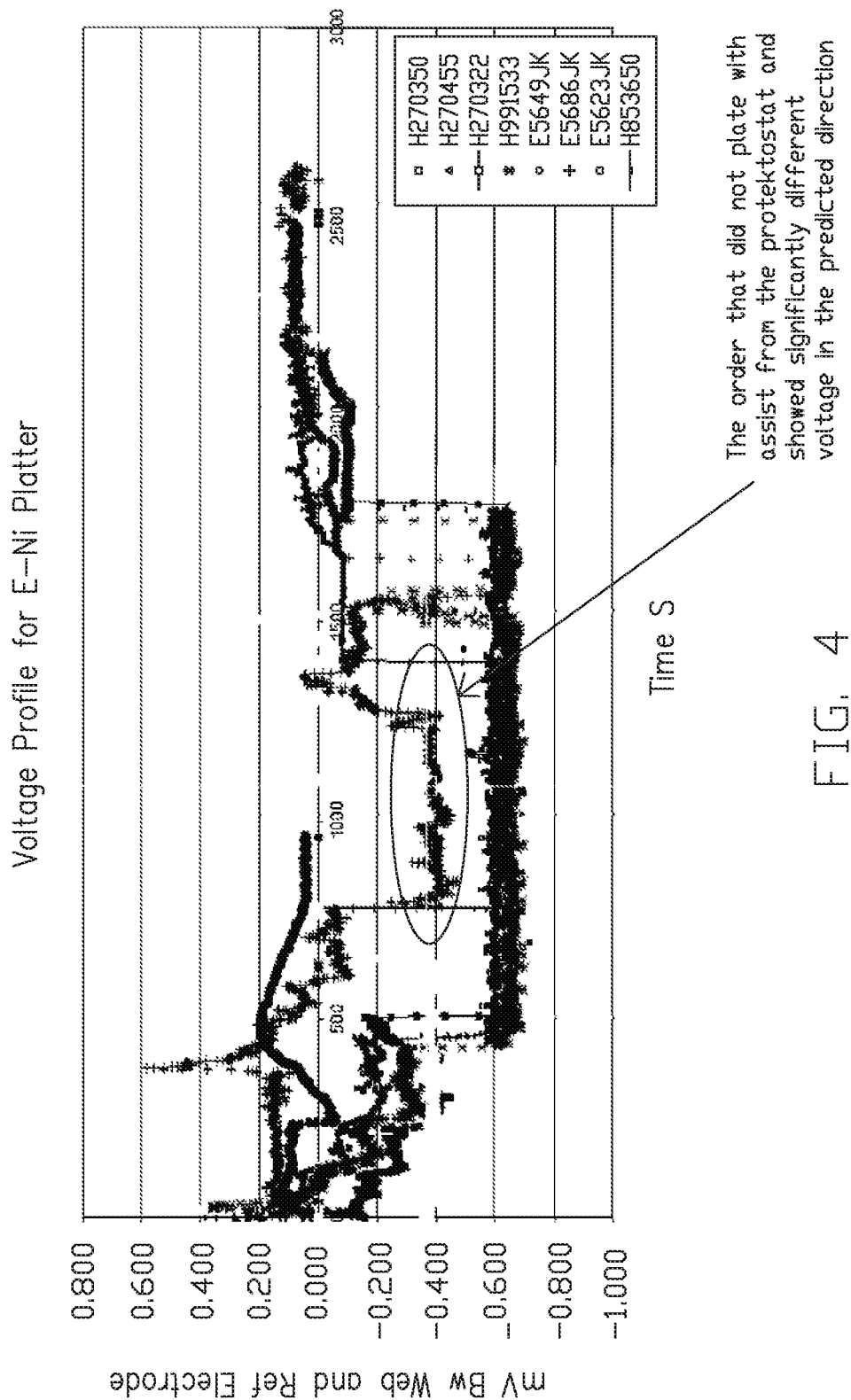
FIG. 4 is a graphical representation of ions (dashed line), voltage (in mV) between the web and reference electrode plotted against time (in seconds)

A voltage profile for E-Ni plater can be seen in graphical form in FIG. 4. The voltage (in mV between the web and the reference electrode 18) is plotted against time (in sec.). Using a voltage controller rectifier, control over activation of plating worked in seven of eight runs, or most of the time. Only in one instance, was there no plating, even with assist from the PROTECTOSTAT™ as we call our system 9, and in fact, showed significantly different voltage from the predicted direction.

Figure 5:
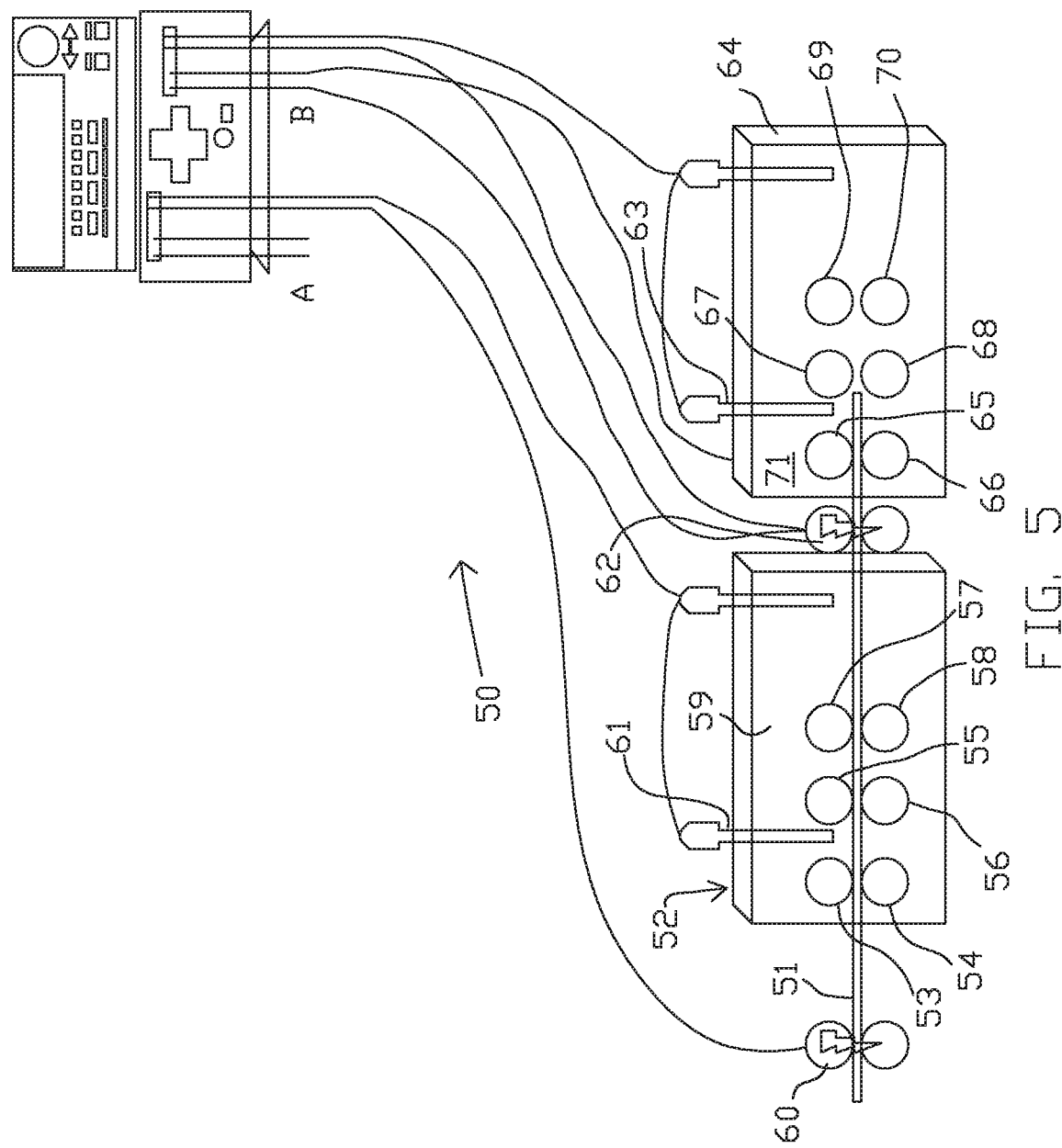
FIG. 5 is a schematic representation of a electroless plating system, according to an embodiment, which has been modified to apply current to the web via the bath while measuring web to plating bath voltage difference for control of the plating process.
Figure 6:
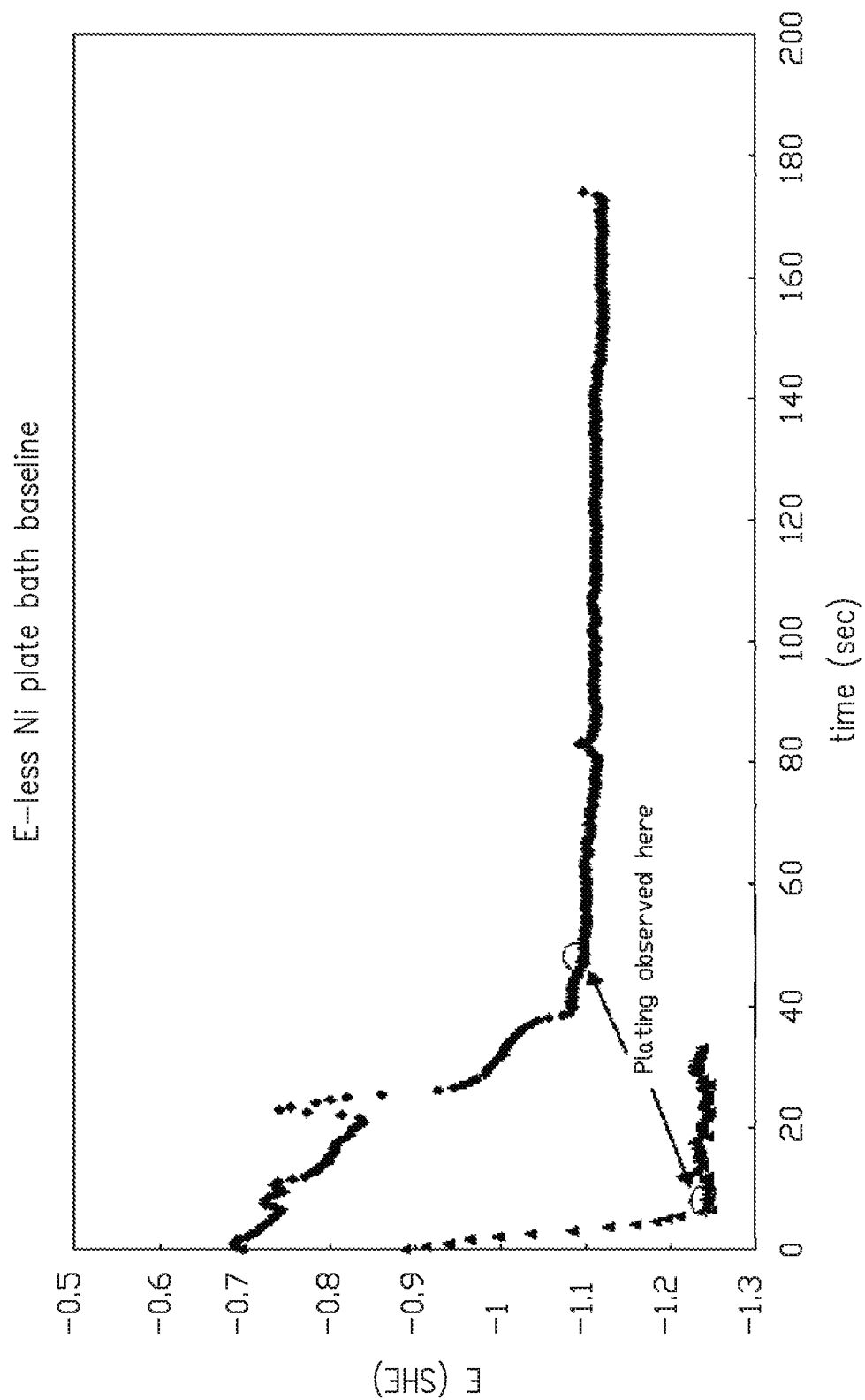
FIG. 6 is a graphical representation of laboratory (beaker scale) experiments performed utilizing the present process, according to an embodiment, in comparison to published voltage trends with E (SHE) plotted versus time (in sec.).

As shown in FIG. 5, an industrial system 50 is envisioned wherein a web 51, carrying continuous or isolated Cu parts, enters module 52 which comprises a series of conveying rollers 53-54, 55-56, and 57-58 to convey web 51 and its associated copper parts through bath 59. A reference voltage is measured between points 60 and 61. The web 51, and its associated Cu parts then enters plating module 64. Plating module 64 also comprises series of conveying rollers 65-66, 67-68 and 69-70. Voltage is again measured between points 62 and 63. Plating on the Cu parts occurs in plating module 64. The voltage measurements between point 62 and point 63 in the plating bath 71 would indicate whether plating is occurring on the Cu parts in plating module 64.

By adding a sensor to a plating module as shown in FIG. 2, reliable activation feedback by voltage measurement can be ascertained, as no current can flow through the sensor. Once a current source has been added, the voltage can be manipulated to the desired value. For various embodiments, the foregoing is implemented in a reel-to-reel system where the web 10 can be considered as continuous.

Although we have disclosed some embodiments, in connection with the appended drawings, such embodiments are to be viewed as exemplary only as one skilled in the art, to whom this disclosure is directed, will readily envision modification and other embodiments without the exercise of invention.

We claim:

1. An electroless method of plating a metal on a substrate comprising:
   providing a substrate upon which to plate a metal, the substrate being carried by a web;
   introducing the web, including the substrate upon which to plate the metal, into a plating bath;
   establishing a voltage existing in said bath by placing an electrode in contact with the bath and in contact with a roller contacting the web outside the bath;
   determining a reference voltage at which plating will initiate on the substrate; and,
   applying a bias current to the web sufficient to initiate plating only on the substrate but not on the web.

2. The method of claim 1, wherein the metal to be plated comprises nickel.

3. The method of claim 2, wherein the substrate comprises copper.

4. The method of claim 1, wherein the web comprises stainless steel.

5. The method of claim 2, wherein palladium may be is provided in contact with the substrate of copper.

6. The method of claim 1, wherein the step of supplying current controls the reference voltage.

7. The method of claim 1, wherein the substrate upon which to plate the metal is a plurality of discrete copper traces.

8. The method of claim 1, wherein the web is continuous, but the substrate upon which to plate the metal are discrete traces carried by the web.

9. The method of claim 1, wherein the substrate is copper and the web is stainless steel.

10. The method of claim 9, wherein the ratio of area of the substrate bussed to the area of the web affects the plating on the substrate.

11. The method of claim 1, wherein the applying of bias current is adjusted to maintain a constant reference voltage to assure continuous initiation of plating as the web is fed into the bath.

12. The method of claim 1, further comprising sensing of the reference voltage to determine plating initiation and ramping down the bias current to prevent electro- and electroless-hybrid plating.

13. The method of claim 4, wherein the bias current is dependent on the state of passivation of the stainless steel web.

14. A method of electroless nickel plating only on a copper substrate carried by a continuous stainless steel web on not on the web itself comprising:
   introducing a continuous stainless steel web into a plating bath;
   wherein the plating bath comprises nickel to be plated on the substrate;

arranging a continuous substrate, or a plurality of spaced substrates, of copper bussed to the stainless steel web;

applying a bias current to the web to initiate the nickel plating on the copper substrate.

15. The method of claim 14, further including the step of establishing a reference voltage existing on the web in the bath.

16. The method of claim 15, wherein the step of establishing the reference voltage comprises placing a reference electrode in contact with the bath containing the web near the point of entry of the web into the bath and measuring the voltage difference with a roller in contact with the web before it enters the bath.

17. The process of claim 14, further comprising sensing the reference voltage to determine plating initiation and ramping down the bias current to prevent electro- or electroless-hybrid plating.

18. The method of claim 14, further comprising adjusting the bias current to maintain a constant reference voltage to assure continuous initiation of plating on the copper substrate as the web is introduced into the bath.

19. The method of claim 14, wherein palladium is placed in contact with the copper of the substrate.

20. A method of electroless nickel plating only on a copper substrate carried by a continuous stainless steel web and not on the web itself comprising:

introducing a continuous stainless steel web into a plating bath;

wherein the plating bath comprises nickel to be plated on the substrate;

arranging a continuous substrate, or a plurality of spaced substrates, of copper bussed to the stainless steel web;

establishing a voltage difference between the bath containing the stainless steel web and the web before it enters the bath by placing a reference electrode in contact with the bath;

applying a bias current to the web to initiate the nickel plating on the copper substrate;

sensing the voltage to determine plating initiation; and, ramping down current to prevent electro- or electroless-hybrid plating.

* * * * *